(12) United States Patent
Dubovsky et al.

(10) Patent No.: US 6,714,414 B1
(45) Date of Patent: Mar. 30, 2004

(54) SPRING SPACER ASSEMBLIES FOR MAINTAINING ELECTRICAL COMPONENTS IN CONTACT WITH THERMAL TRANSFER SURFACES

(75) Inventors: Stephen M. Dubovsky, Silver Spring, MD (US); William Mellema, Timonium, MD (US)

(73) Assignee: Morningstar Corporation, Columbia, MD (US)

( * ) Notice: Subject to any disclaimer, the term of this patent is extended or adjusted under 35 U.S.C. 154(b) by 0 days.

(21) Appl. No.: 10/359,660

(22) Filed: Feb. 7, 2003

(51) Int. Cl.[7] .................................................. H05K 7/20
(52) U.S. Cl. ........................ 361/704; 361/707; 361/718; 361/719; 257/718; 257/722; 174/16.3; 165/80.3; 165/185
(58) Field of Search .................................. 361/704, 707, 361/718, 719; 257/718, 722; 174/16.3; 165/80.4, 185

(56) References Cited

U.S. PATENT DOCUMENTS

| | | | | |
|---|---|---|---|---|
| 4,845,590 A | * | 7/1989 | Mikolajczak | 361/720 |
| 4,922,601 A | * | 5/1990 | Mikolajczak | 29/450 |
| 4,923,179 A | * | 5/1990 | Mikolajczak | 267/160 |
| 5,321,582 A | * | 6/1994 | Casperson | 361/713 |
| 5,363,552 A | * | 11/1994 | Coniff | 29/840 |
| 5,383,092 A | * | 1/1995 | Liberati | 361/704 |
| 5,450,284 A | * | 9/1995 | Wekell | 361/710 |
| 5,466,970 A | * | 11/1995 | Smithers | 257/712 |
| 5,483,103 A | * | 1/1996 | Blickhan et al. | 257/718 |
| 5,990,549 A | * | 11/1999 | Chiu et al. | 257/706 |
| 5,991,151 A | * | 11/1999 | Capriz | 361/704 |
| 6,049,459 A | * | 4/2000 | Edmonds et al. | 361/707 |
| 6,084,773 A | * | 7/2000 | Nelson et al. | 361/704 |
| 6,088,226 A | * | 7/2000 | Rearick | 361/704 |
| 6,222,733 B1 | * | 4/2001 | Gammenthaler | 361/705 |
| 6,313,995 B1 | * | 11/2001 | Koide et al. | 361/705 |
| 6,545,352 B1 | * | 4/2003 | Ruckdeschel | 257/718 |
| 6,560,113 B1 | * | 5/2003 | Ma | 361/719 |
| 6,617,685 B1 | * | 9/2003 | Bollesen | 257/719 |

* cited by examiner

Primary Examiner—Boris Chervinsky (57) ABSTRACT

A spring spacer assembly maintains thermal contact between a thermal transfer surface of a heat sink and a heat-generating electrical component mounted on a printed circuit board between the printed circuit board and the thermal transfer surface. The spring spacer assembly comprises a face defining a fixation segment and a deflectible finger extending from the fixation segment, and a fixation element for securing the face to the heat sink. A spacer extends from the fixation segment for passage through the printed circuit board into abutment with the thermal transfer surface. A protrusion extends from the finger for passage through the printed circuit board into contact with the heat-generating electrical component. The finger is biased toward the thermal transfer surface and urges the heat-generating electrical component into thermal contact with the thermal transfer surface. The fixation element secures the face to the heat sink with the spacer secured in abutment with the thermal transfer surface. The spring spacer assembly is assembled with a printed circuit board and a heat sink to form a thermally protected electrical component system.

31 Claims, 4 Drawing Sheets

SPRING SPACER ASSEMBLIES FOR MAINTAINING ELECTRICAL COMPONENTS IN CONTACT WITH THERMAL TRANSFER SURFACES

BACKGROUND OF THE INVENTION

1. Field of the Invention

The present invention relates generally to transferring heat from heat-generating electrical components to heat sinks and, more particularly, to spring spacer assemblies for urging heat-generating electrical components into contact with thermal transfer surfaces of heat sinks.

2. Discussion of the Related Art

Many various products incorporate electrical components that become heated during operation. Commonly used electrical components such as FETs (field effect transitors), for example, generate heat during operation which, if not dissipated, may result in damage to the electrical components. Accordingly, many electrical components may be considered heat-generating electrical components that may be impaired when heated above certain temperatures. Overheating of heat-generating electrical components may cause the electrical components to operate improperly or even fail, with the result that the associated products may also operate improperly or fail.

Given the need to protect heat-generating electrical components from overheating, heat sinks are usually used in conjunction with heat-generating electrical components to absorb and dissipate heat therefrom. Typical heat sinks are made from a thermally conductive material to absorb heat from heat-generating electrical components positioned in contact with thermal transfer surfaces of the heat sinks. Oftentimes the heat sinks are configured with fins or other structure to enhance dissipation of the absorbed heat and thereby maximize the thermal capacity of the heat sinks. Since heat sinks are ordinarily made from metal, the thermal transfer surfaces often comprise thermal interfaces made of thermally conductive but non-electrically conductive material secured on surfaces of the heat sinks. The thermal interfaces electrically insulate the heat-generating electrical components from the metal heat sinks while still promoting thermal transfer from the heat-generating electrical components to the heat sinks.

The degree to which heat sinks are effective in absorbing heat from heat-generating electrical components depends in large parton the integrity of the thermal contact maintained between the heat-generating electrical components and the thermal transfer surfaces of the heat sinks. To maximize heat transfer from the heat-generating electrical components, it is desirable to maximize the surface area of the heat-generating electrical components in contact with the thermal transfer surfaces. In addition, it is desirable for the heat-generating electrical components to be forcefully urged into contact with the thermal transfer surfaces with sufficient force applied at locations conducive to maintaining good thermal contact without causing portions of the heat-generating electrical components to move away from the thermal transfer surfaces.

Various mechanical devices have been proposed for maintaining heat-generating electrical components in contact with thermal transfer surfaces of heat sinks as represented by U.S. Pat. No. 2,740,075 to Walker et al, U.S. Pat. Nos. 4,845,590, 4,922,601 and 4,923,179 to Mikolajczak, U.S. Pat. No. 5,321,582 to Casperson, U.S. Pat. No. 5,363,552 to Coniff, U.S. Pat. No. 5,383,092 to Liberati, U.S. Pat. No. 5,450,284 to Wekell, U.S. Pat. No. 5,466,970 to Smithers, U.S. Pat. No. 5,483,103 to Blickhan et al, U.S. Pat. No. 5,648,889 to Bosli, U.S. Pat. No. 5,991,151 to Capriz, U.S. Pat. No. 6,049,459 to Edmonds et al, U.S. Pat. No. 6,084,773 to Nelson et al, U.S. Pat. No. 6,088,226 to Rearick, and U.S. Pat. No. 6,313,995 B1 to Koide et al, and bythe thermal management clips of Thermashield LLC and The Max Clip System™ of AAVID Thermalloy.

As shown by several of the aforementioned references, the heat-generating electrical components may be mounted on printed circuit boards, the heat-generating electrical components typically being disposed along one side of the printed circuit boards with leads of the heat-generating electrical components extending through the printed circuit boards for soldering to the opposite side thereof. The heat sinks are positioned so that the heat-generating electrical components may be placed in contact with the thermal transfer surfaces of the heat sinks. A single printed circuit board may have many heat-generating electrical components mounted thereon, and frequently the heat-generating electrical components are disposed along or near peripheral edges of the printed circuit boards.

Many prior mechanical devices for maintaining heat-generating electrical components in contact with the thermal transfer surfaces of heat sinks operate by forcefully urging the heat-generating electrical components into contact with the thermal transfer surfaces of the heat sinks, but have numerous disadvantages. For example, a single printed circuit board having a plurality of heat-generating electrical components mounted thereon may require a separate mechanical device for each heat-generating electrical component, resulting in additional parts and costs. It is difficult to properly align many prior mechanical devices with the heat-generating electrical components to account for variations in the way that the heat-generating electrical components are mounted to the printed circuit boards. It is difficult to disassemble or remove many conventional mechanical devices from the printed circuit boards, the heat sinks and/or the heat-generating electrical components such that many devices are essentially non-removable or permanent, thereby limiting future repair or replacement. Many mechanical devices for maintaining heat-generating electrical components in contact with the thermal transfer surfaces of heat sinks require highly customized heat sinks to accommodate the devices so that the use of less costly heat sinks is precluded. In addition, it is common for conventional mechanical devices to require larger size heat sinks in order to mount the mechanical devices, and the need for larger heat sinks increases the cost and size of the associated products. Products in which conventional mechanical devices are used to maintain heat-generating electrical components in contact with the thermal transfer surfaces of heat sinks will generally have a larger size footprint due to the presence of the mechanical devices. Where the mechanical devices comprise clips, the clips ordinarily extend beyond the periphery of the printed circuit boards, resulting in a larger footprint. Larger size footprints may be unsuitable for many applications, such as those in which the associated products must fit on pre-fabricated, standard size mounting panels and assemblies. Clips and other prior mechanical devices may also significantly increase the height or depth of the assemblies formed by the printed circuit boards, the heat sinks and the clips or other mechanical devices, and such size increases are usually undesirable.

Many conventional mechanical devices provide inferior thermal contact between the heat-generating electrical components and the thermal transfer surfaces of the heat sinks due to insufficient forces applied to the heat-generating electrical components, the application of non-uniform forces and/or the application of forces at undesirable locations causing portions of the heat-generating electrical components to move away from the thermal transfer surfaces. Examples of mechanical devices having this drawback are those comprising screws or other threaded fasteners extending through the heat-generating electrical components into the heat sinks and capable of being tightened to urge the heat-generating electrical components into contact with the thermal transfer surfaces of the heat sinks. The screws or other threaded fasteners, one of which is needed for each heat-generating electrical component, add to the cost and labor intensiveness of assembly. Furthermore, consistent, repeatable torque control of screws and threaded fasteners is difficult to attain. Under-tightening or under-torqueing the screws or other threaded fasteners results in insufficient force being applied to the heat-generating electrical components with concomitant poor thermal contact. Screws and other threaded fasteners are also susceptible to being over-torqued or over-tightened, potentially damaging the heat-generating electrical components and/or causing portions of the heat-generating electrical components to pivot, tilt or otherwise move out of contact with the thermal transfer surfaces. Undesirable tilting, pivoting or moving of the heat-generating electrical components out of contact with the thermal transfer surfaces as a result of non-axial or substantially non-axial force or pressure may also occur in clips and other types of prior mechanical devices in addition to those employing screws or threaded fasteners through the heat-generating electrical components. It is also possible with many prior mechanical devices for the heat-generating electrical components to move out of thermal contact with the thermal transfer surfaces in response to vibration, thermal expansion and/or thermal contraction, such that thermal contact is not continuously maintained. Many prior mechanical devices are susceptible to becoming loose and causing thermal contact to be impaired.

It is seen from the above that there is a need for a mechanical device for urging one or more heat-generating electrical components mounted on a printed circuit board into contact with a thermal transfer surface of a heat sink in a manner maximizing the surface area of the one or more heat-generating electrical components maintained in contact with the thermal transfer surface while ensuring good thermal contact along the entire surface area to maximize heat transfer. There is a further need for a mechanical device which is easily assembled to a printed circuit board and a heat sink to bias one or more heat-generating electrical components on the printed circuit board into contact with a thermal transfer surface of the heat sink, and is also easily disassemblable from the printed circuit board and heat sink. An additional need exists for a single mechanical device capable of urging a plurality of heat-generating electrical components on a printed circuit board into contact with a thermal transfer surface of a heat sink while conserving parts, labor and cost. There is also a need for a mechanical device for being assembled with a printed circuit board and heat sink to urge one or more heat-generating electrical components on the printed circuit board into contact with a thermal transfer surface of the heat sink without increasing the peripheral size or footprint for the assembled printed circuit board and heat sink.

SUMMARY OF THE INVENTION

Accordingly, it is a primary object of the present invention to overcome the aforementioned disadvantages of prior mechanical devices used to maintain heat-generating electrical components in contact with thermal transfer surfaces of heat sinks.

Another object of the present invention is to maximize the surface area of a heat-generating electrical component maintained in good thermal contact with a thermal transfer surface of a heat sink.

A further object of the present invention is to optimize thermal contact between a heat-generating electrical component and a thermal transfer surface of a heat sink.

An additional object of the present invention is to urge a surface of a heat-generating electrical component into contact with a thermal transfer surface of a heat sink with more uniform pressure along the surface of the electrical component.

The present invention has as another object to provide a spring spacer assembly for urging a heat-generating electrical component on a printed circuit board into contact with a thermal transfer surface of a heat sink without increasing the footprint of the printed circuit board and/or heat sink.

It is also an object of the present invention to simplify assembly of a printed circuit board and heat sink to a spring spacer assembly used to urge one or more heat-generating electrical components on the printed circuit board into contact with a thermal transfer surface of the heat sink.

Moreover, it is an object of the present invention to enhance the reliability of heat-generating electrical components by optimizing thermal management of the heat-generating electrical components.

Still another object of the present invention is to provide an individual spring spacer assembly capable of urging a plurality of heat-generating electrical components on a printed circuit board into contact with a thermal transfer surface of a heat sink in response to the spring spacer assembly being fastened to the heat sink through the printed circuit board.

The above-mentioned objects are achieved independently and in combination, and it is not intended that the present invention be construed as requiring two or more objects to be combined unless expressly required by the claims.

Some of the advantages of the present invention are that the spring spacer assembly can be designed for any number of heat-generating electrical components; the spring spacer assembly does not include any parts which penetrate or pass through the heat-generating electrical components; the spring spacer assembly comprises a minimum number of simple parts which may be assembled to a heat sink with conventional threaded fasteners or screws; the spring spacer assembly can be used with various types of heat-generating electrical components and, in particular, with FETs; the force exerted by the spring spacer assembly on a heat-generating electrical component can be selectively varied by varying the spring strength and/or deflection; the thermal transfer surface of the heat sink may comprise a conventional thermal interface secured on a surface of the heat sink; conventional printed circuit boards, heat sinks and thermal interfaces can be minimally modified with appropriate holes or apertures for use with the spring spacer assembly; the spring spacer assembly confines the printed circuit board and ensures proper spacing of the printed circuit board in relation to the heat sink; proper force on the heat-generating electrical components is established consistently and repeatedly to ensure good quality control; tilting of the heat-generating electrical components is avoided; alignment of the spring spacer assembly with the heat-generating electrical components is facilitated; alignment of the spring spacer assembly with the heat-generating electrical components is achieved even where variations occur in the way the heat-generating electrical components are mounted; maintenance and repair are simplified since the spring spacer assembly is easily disassembleable or removable; and loss of good thermal contact due to vibration, thermal expansion and/or thermal contraction is avoided.

These and other objects, advantages and benefits are realized with the present invention as generally characterized in a spring spacer assembly for maintaining thermal contact between a thermal transfer surface of a heat sink and a heat-generating electrical component mounted on a printed circuit board between the printed circuit board and the thermal transfer surface. The spring spacer assembly comprises a spring spacer including a face defining a fixation segment and a deflectible finger extending from the fixation segment, a spacer extending from the fixation segment along a first side of the face, and a protrusion extending from the finger along the first side of the face. The spacer is insertable through a corresponding hole in the printed circuit board for abutment with the thermal transfer surface with the printed circuit board disposed between the thermal transfer surface and the face. The protrusion is insertable through a corresponding hole in the printed circuit board to contact the heat-generating electrical component and cause deflection of the finger in a direction away from the thermal transfer surface as the spacer is positioned in abutment with the thermal transfer surface. A fixation element of the spring spacer assembly secures the face to the heat sink with the spacer secured in abutment with the thermal transfer surface. When the spacer is secured in abutment with the thermal transfer surface, the deflected finger is biased toward the thermal transfer surface so as to apply a force against the heat-generating electrical component, via the protrusion in contact therewith, in the direction of the thermal transfer surface. The force applied by the deflected finger urges the heat-generating electrical component into thermal contact with the thermal transfer surface.

In one embodiment, the spring spacer comprises a spacer member defining the face and also comprises a separate spring disposed over a second side of the face, opposite the first side, for biasing the deflected finger toward the thermal transfer surface. Where a separate spring is provided, the finger itself may be resiliently biased toward the thermal transfer surface such that some of the spring force is applied by the spacer member. In another embodiment, the spacer member applies the entire force needed to urge the heat-generating electrical component into thermal contact with the thermal transfer surface without a separate spring.

The face is disposed in an undeflected configuration prior to the protrusion contacting the heat-generating electrical component and is moved to a deflected configuration in response to the protrusion contacting the heat-generating electrical component as the spacer is placed in abutment with the thermal transfer surface. In the undeflected configuration, the finger is in an initial position relative to the fixation segment, and in the deflected configuration the finger is moved relative to the fixation segment from the initial position in a direction away from the thermal transfer surface. The finger may be co-planar with the fixation segment in the undeflected configuration and may extend at an angle to a plane of the fixation segment in the deflected configuration. The length of the protrusion may be selected to obtain a predetermined amount of deflection of the finger in accordance with the thickness of the portion of the heat-generating electrical component contacted by the protrusion. The finger may extend laterally from the fixation segment to a tip, and the protrusion may be disposed at or near the tip to facilitate deflection of the finger. The finger may have various surface configurations including triangular and rectangular surface configurations. The spacer and protrusion can have various configurations.

The spring may be disposed in an undeformed condition prior to deflection of the finger and moved to a deformed condition by the finger as it is deflected. The spring may have a surface configuration matching or corresponding to the geometric shape of the surface configuration of the face. The spring may comprise a fixation segment disposed over the fixation segment of the face and a finger disposed over the finger of the face. The spring may be planar in the undeformed condition, with the finger of the spring being deflected correspondingly by the finger of the face so that the finger of the spring is disposed at an angle to the fixation segment of the spring in the deformed condition. Deflection of the finger of the spring is used to impart a biasing force against the finger of the face having its protrusion in contact with the heat-generating electrical component, since the spring is biased toward its undeformed condition.

The fixation element may comprise a screw for threaded engagement in a threaded hole of the heat sink. A passage may extend through the face and the spacer for receiving the fixation element therethrough. Where a spring is disposed over the second side of the face, the fixation element may extend through the spring. The spring spacer assembly may comprise a fixation member for being secured over the fixation segment along the second side of the face, and the fixation element may extend through the fixation member so that the fixation member is tightened against the fixation segment when the fixation element is engaged with the heat sink. The spring disposed over the second side of the face may be disposed between the face and the fixation member, and the fixation element may pass through the spring.

The face can have a fixation segment of any desired length and width with any desired number of fingers extending from the fixation segment along its length and/or width in accordance with the number of heat-generating electrical components between the printed circuit board and the thermal transfer surface of the heat sink. Any desired number of spacers can be provided along the length and/or width of the fixation segment, and a fixation element can extend through each spacer into engagement with the heat sink. The spring may have a finger for each finger of the spacer member. Accordingly, an individual spring spacer assembly may be used to maintain a plurality of heat-generating electrical components in thermal contact with a thermal transfer surface of a heat sink.

The present invention is further generally characterized in a thermally protected electrical component system comprising a heat sink having a thermal transfer surface, a printed circuit board spaced from the thermal transfer surface and having a heat-generating electrical component mounted thereon between the thermal transfer surface and a first side of the printed circuit board, and a spring spacer assembly secured to the heat sink via the printed circuit board. The printed circuit board has an aperture therethrough in alignment with the heat-generating electrical component and also has a hole therethrough. The spring spacer assembly comprises a face disposed over a second side of the printed circuit board, opposite the first side, and defining a fixation segment and a deflectible finger extending from the fixation segment. A spacer extends from the fixation segment through the hole and is secured in abutment with the heat sink. The protrusion extends through the aperture in the printed circuit board into contact with the heat-generating electrical component The finger is spring biased toward the thermal transfer surface to apply a force against the heat-generating electrical component, via the protrusion in contact therewith, to urge the heat-generating electrical component into thermal contact with the thermal transfer surface.

Other objects and advantages of the present invention will become apparent from the following description of the preferred embodiments taken in conjunction with the accompanying drawings wherein like parts in each of the several figures are identified by the same reference characters.

DESCRIPTION OF THE PREFERRED EMBODIMENTS

Figures 1, 2:
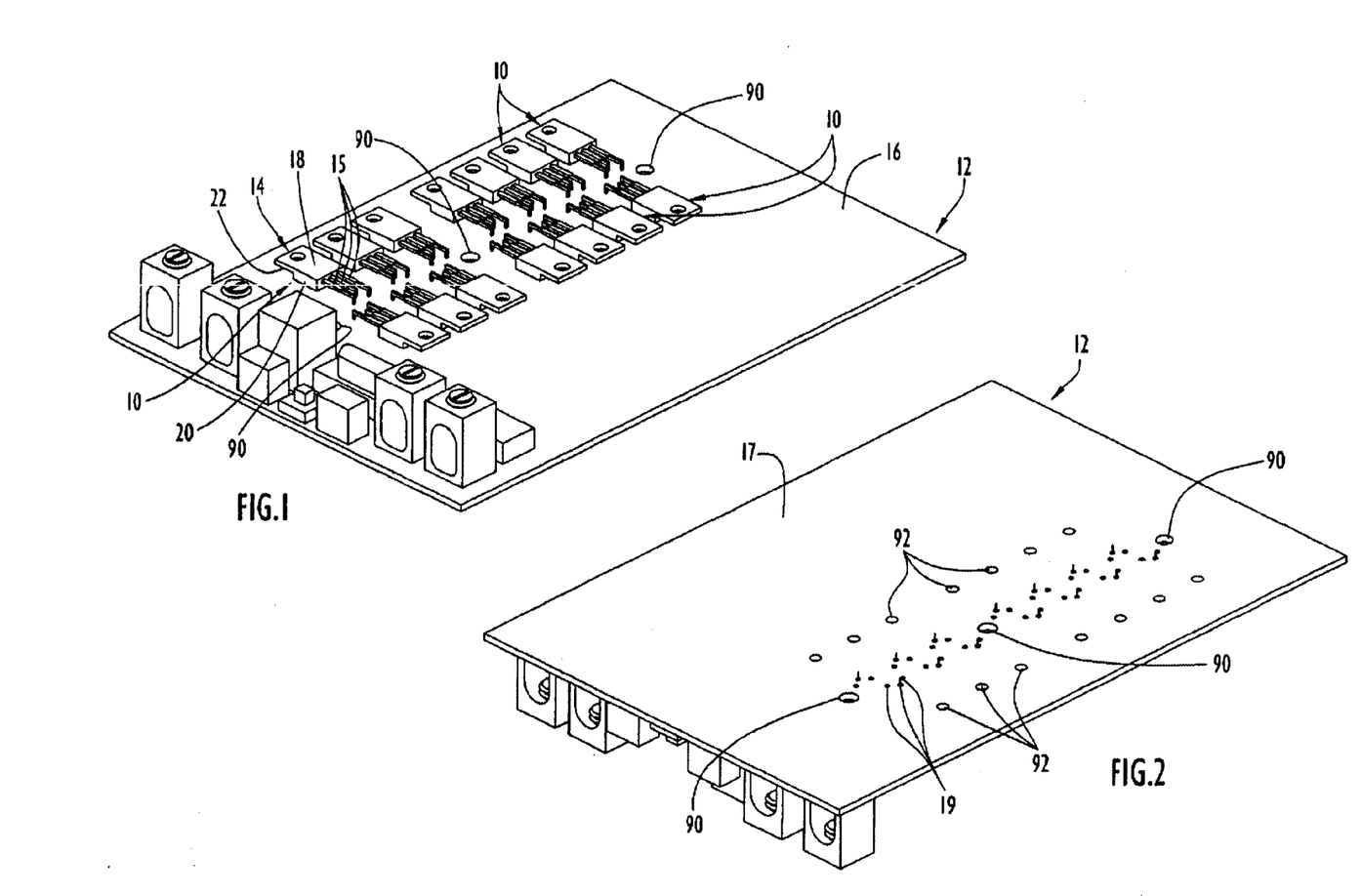
FIG. 1 is a perspective view of one side of a printed circuit board having a plurality of heat-generating electrical components mounted thereon.
FIG. 2 is a perspective view of an opposite side of the printed circuit board depicting leads of the heat-generating electrical components soldered to the printed circuit board.
Figure 3:
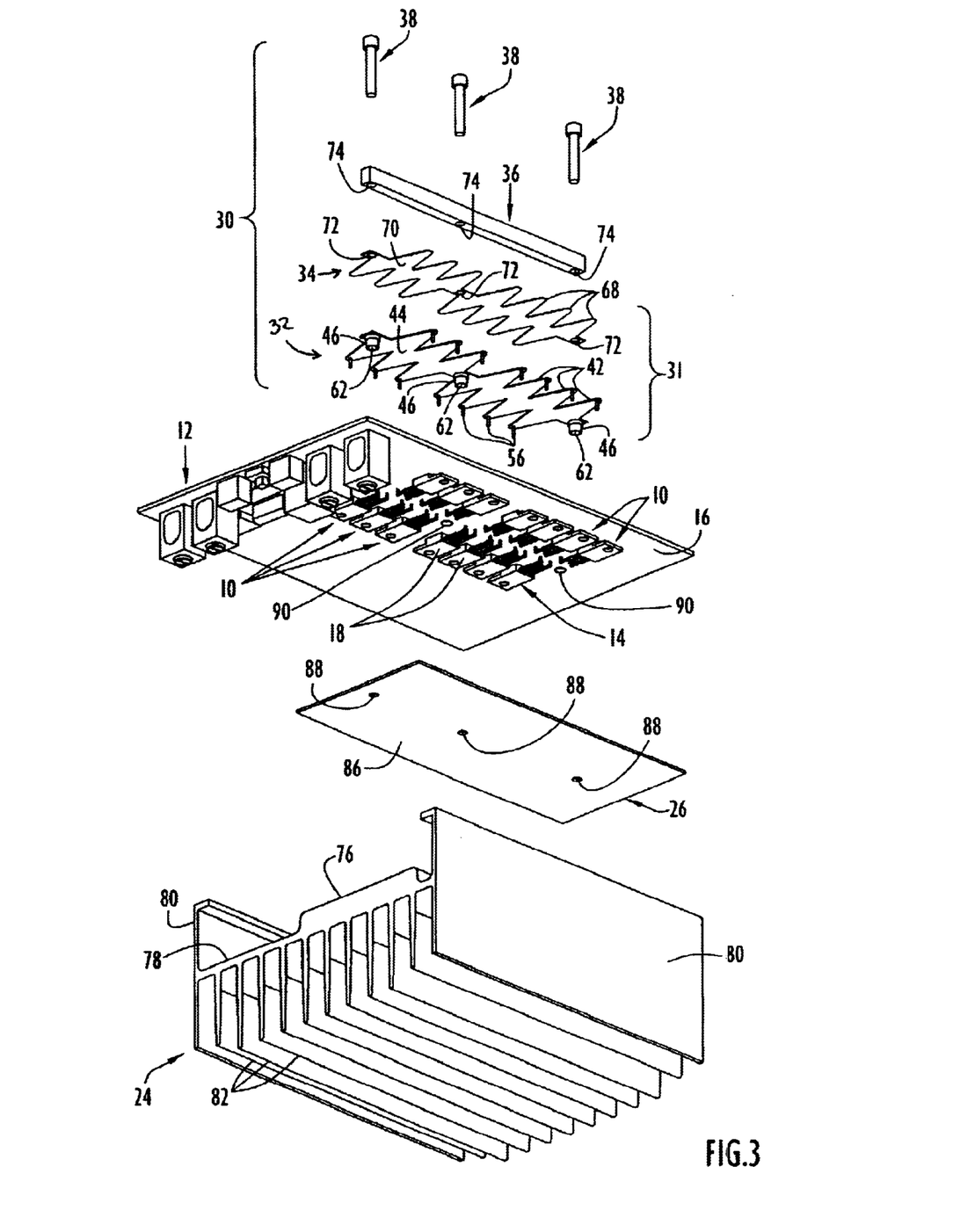
FIG. 3 is an exploded perspective view of a thermally protected electrical component system incorporating a spring spacer assembly according to the present invention for maintaining the heat-generating electrical components mounted on the printed circuit board in contact with a thermal transfer surface of a heat sink.
Figure 4:
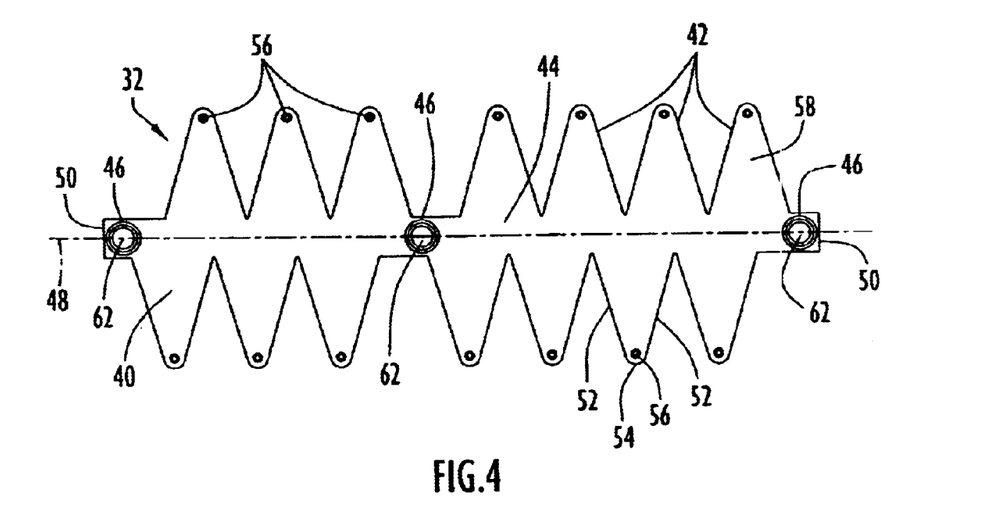
FIG. 4 is a plan view of a spacer member of the spring spacer assembly.
Figure 6:
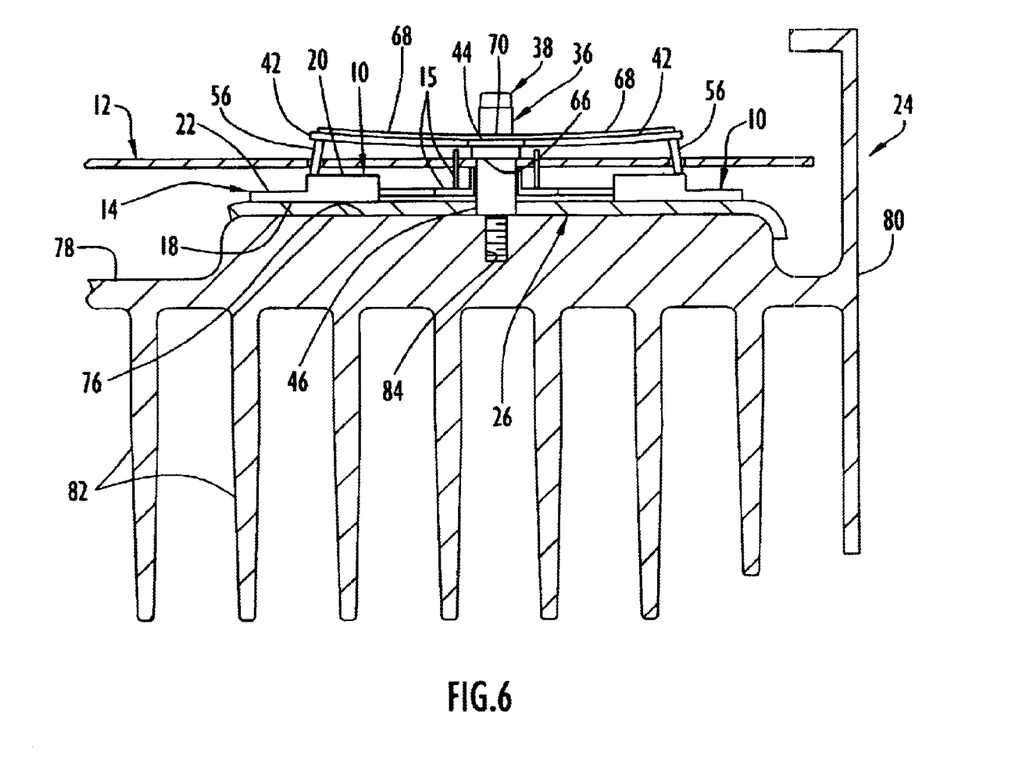
FIG. 6 is a broken view, partly in section, depicting the thermally protected electrical component system with the spring spacer assembly assembled to the printed circuit board and the heat sink to urge the heat-generating electrical components into thermal contact with the thermal transfer surface of the heat sink.

The spring spacer assembly of the present invention is used to position one or more heat-generating electrical components mounted on a printed circuit board or substrate in thermal contact with a thermal transfer surface of a heat sink. FIGS. 1, 3 and 6 illustrate a plurality of heat-generating electrical components 10 mounted on a printed circuit board or substrate 12. The heat-generating electrical components 10 are illustrated as FETs and, in particular, as MOSFETs such as the FDB2532/FDP2532/FDI2532 N-Channel Power Trench® MOSFETs of Fairchild Semiconductor Corporation. However, it should be understood that the spring spacer assembly of the present invention may be used with various diverse types of heat-generating electrical components other than FETs as well as with various diverse types of FETs and MOSFETs. The heat-generating electrical components 10 each comprise a body 14 and one or more leads 15 extending from the body 14. The bodies 14 are disposed along a first side 16 of the printed circuit board 12, with the leads 15 being bent to extend through holes in the printed circuit board to a second side 17 thereof, opposite the first side, as shown in FIGS. 2 and 6. Ends of the leads 15 which protrude from the holes on the second side 17 of the printed circuit board 12 are electrically connected, such as by soldering 19, to the printed circuit board.

The heat-generating electrical components 10 carry electric current and may be switched on and off during operation. As a result of carrying current and/or being switched on and/or off, the heat-generating electrical components 10 generate heat during operation and may become heated above a safe temperature for the heat-generating electrical components. Heat-generating electrical components which are heated above their safe temperatures may be damaged and may even fail, thusly compromising the entire electric circuit. Accordingly, each body 14 has a thermal transfer surface 18 for positioning in thermal contact with a thermal transfer surface of a heat sink 24 so that heat is transferred from the heat-generating electrical component to the heat sink to avoid overheating the heat-generating electrical component as represented by FIGS. 3 and 6.

The structure of bodies 14 may vary for different types of heat-generating electrical components. The illustrated bodies 14 each comprise a relatively thicker main body section 20 and a relatively thinner flange section 22 extending from a side of the main body section 20. The leads 15 may extend from the main body section 20 in a direction opposite the flange section 22. The thermal transfer surface 18 for each body 14 faces away from the printed circuit board 12 and is depicted as extending along the main body section 20 and the flange section 22. The thermal transfer surfaces 18 are illustrated as being planar, although typically the surfaces 18 have microscopic irregularities. Depending on the type of heat-generating electrical components, the thermal transfer surfaces 18 may be planar or non-planar, may be defined by a surface of the main body section and/or a surface of the flange section, and may be continuous or discontinuous. Since the leads 15 are bendable, the bodies 14 are movable to some extent relative to the printed circuit board 10 to facilitate the thermal transfer surfaces 18 being forcefully urged into contact with the thermal transfer surface of heat sink 24 as explained further below.

It is typical for the heat sink 24 to be made of metal and for all or part of the thermal transfer surfaces 18 to be made of metal or other electrically conductive materials, making it desirable to electrically insulate the heat-generating electrical components 10 from the heat sink 24 so that the heat sink does not carry electric current. In order to electrically insulate the heat-generating electrical components 10 from the heat sink 24, a thermally conductive but non-electrically conductive thermal interface 26 may be interposed between the thermal transfer surfaces 18 and the heat sink 24 such that the surfaces 18 are in contact with the thermal interface 26 as shown by FIGS. 3 and 6 and as described further below. Normally, the thermal interface 26 is attached to a surface of the heat sink 24, typically with an adhesive attachment. The bodies of the heat generating electrical components 10 could be insulated by design, with the thermal interface 26 comprising a layer or coating of grease or other suitable thermal interface compounds or materials. Accordingly, the thermal transfer surface of the heat sink 24 in contact with the thermal transfer surfaces 18 of the heat-generating electrical components 10 may be defined by the thermal interface 26, but could alternatively or additionally be defined by the surface of the heat sink where no thermal interface is provided.

The heat-generating electrical components 10 are normally supplied with pre-formed holes in the flange sections 22 for receiving screws by which the heat-generating electrical components may be screwed into a heat sink to force the thermal transfer surfaces 18 into thermal contact with a thermal transfer surface of the heat sink as is conventionally known. When screws are used to position the thermal transfer surfaces 18 in contact with the thermal transfer surface of the heat sink, it is possible for the screws to be under-tightened or over-tightened. Under-tightening the screws results in poor thermal contact between the thermal transfer surfaces 18 and the thermal transfer surface of the heat sink, while over-tightening may cause portions of the surfaces 18 to move away from the thermal transfer surface of the heat sink and out of thermal contact therewith. With the present invention, the use of screws inserted through the heat-generating electrical components 10 is eliminated along with its numerous attendant disadvantages.

As best seen in FIGS. 1 and 3, the printed circuit board 12 has first and second linear rows of heat-generating electrical components 10 along the first side 16. Each row of heat-generating electrical components comprises a first set of three heat-generating electrical components and a second set of four heat-generating electrical components longitudinally spaced from the first set. The heat-generating electrical components within each set may be equally or substantially equally spaced from one another. Also, the first and second rows are longitudinally offset from one another. The heat-generating electrical components 10 of the first row have their bodies 14 separated from the bodies 14 of the heat-generating electrical components 10 of the second row by a space along the first side 16, and the leads 15 extend from the bodies 14 into this space for passage through the holes in the printed circuit board. The flange sections 22 for the heat-generating electrical components 10 of the first row extend in a direction opposite to the flange sections 22 for the heat-generating components 10 of the second row. However, it should be appreciated that the flange sections of the first and second rows may extend toward one another or in any other suitable direction. One of the rows of heat-generating components 10 has its bodies 14 disposed dose to a peripheral edge of the printed circuit board 12. Of course, it should be appreciated that various other electrical and non-electrical components may be mounted on the printed circuit board in addition to the heat-generating electrical components 10.

A spring spacer assembly 30 according to the present invention is illustrated in FIGS. 3 and 6 and is used to position the thermal transfer surfaces 18 in thermal contact with the thermal transfer surface of heat sink 24. The spring spacer assembly 30 comprises a spring spacer 31, a fixation member 36 and one or more fixation elements 38. The spring spacer assembly 30 is designed to position all of the heat-generating electrical components 10 of printed circuit board 12 in contact with the thermal transfer surface of heat sink 24; however, it should be appreciated that an individual spring spacer assembly can be designed for positioning one or any number of heat-generating electrical components in contact with a thermal transfer surface of a heat sink as described further below. The spring spacer 31 comprises a spacer member 32 and a spring 34. The spacer member 32, as shown in FIGS. 3–6, comprises a face 40 configured as a plurality of deflectable fingers 42 extending laterally from a fixation segment 44, one finger 42 being provided for each heat-generating electrical component 10. The fixation segment 44 extends longitudinally the length of spacer member 32 and has a central longitudinal axis 48 and opposed ends 50. The fingers 42 are arranged along the length of fixation segment 44 on opposite sides of central longitudinal axis 48, and the fingers extend laterally outwardly from the fixation segment in a direction perpendicular or transverse to the central longitudinal axis. The ends 50 of fixation segment 44 extend longitudinally beyond the fingers 42. The central longitudinal axis 48 also defines the central longitudinal axis of the face 40.

Figure 5:
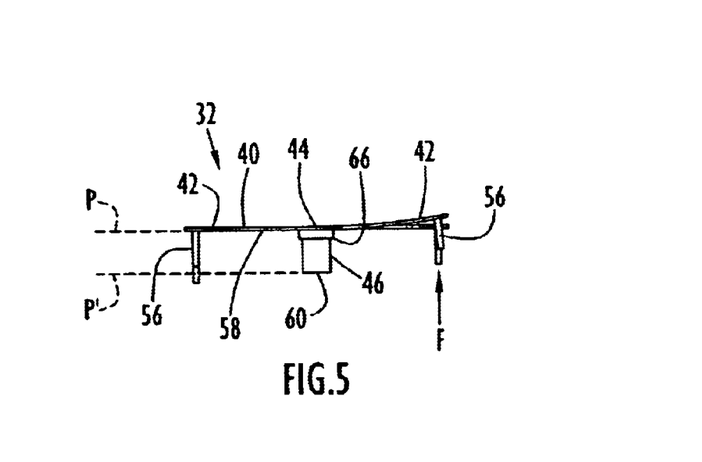
FIG. 5 is an end view of the spacer member illustrating deflection of a finger of the spacer member.

Each finger 42 has a base joined to the fixation segment 44 and has straight side edges 52 extending angularly inwardly toward one another from the base to a tip 54. Accordingly, the width of each finger 42 is tapered from its base to its tip such that the fingers have a generally triangular surface configuration with the tips 54 being rounded. The fingers 42 and the fixation segment 44 are co-planar in an undeflected configuration for the face 40 as shown in FIG. 3; however, the fingers 42 are capable of moving or deflecting relative to the fixation segment 44 to a deflected configuration for the face 40 in which the fingers are disposed at an angle to a plane P of the fixation segment 44 as shown in FIGS. 5 and 6 and as explained further below. In FIG. 5, only one finger 42 is shown deflected. Although the face 40 is shown as being planar in the undeflected configuration and of uniform thickness, it should be appreciated that the face 40 may be planar or non-planar in the undeflected configuration and may be of any desirable uniform or non-uniform thickness.

The number and arrangement for the fingers 42 along the fixation segment 44 correspond to the number and arrangement for the heat-generating electrical components 10 along the first side 16 of the printed circuit board 12. In the illustrated embodiment, a first group of four fingers 42 and a second group of three fingers 42 are linearly arranged along the fixation segment 44 on each side of the central longitudinal axis 48, with there being a gap or space along the fixation segment 44 between the first groups and the second groups. The first and second groups of fingers 42 on one side of the central longitudinal axis 48 are longitudinally offset from the first and second groups of fingers 42 on the opposite side of the central longitudinal axis 48 in the same manner that the first and second rows of heat-generating electrical components 10 are longitudinally offset from one another. Within each group of fingers 42, the side edges 52 of adjacent fingers 42 meet one another at their bases. When the spring spacer assembly 30 is assembled to the printed circuit board 12 and heat sink 24 as described below, the face 40 will be disposed over the second side 17 of the printed circuit board 12 with the fixation segment 44 in alignment with the space between the first and second rows of heat-generating electrical components 10, and a finger 42 will be disposed over each body 14 in alignment therewith. Accordingly, each finger 42 has a length from its base to its tip to ensure alignment of a protrusion on the finger with the body 14 of a corresponding heat-generating electrical component 10 as explained further below.

It should be appreciated that, depending on the number and arrangement of heat-generating electrical components 10, the face 40 can be designed with various numbers and arrangements of fingers 42 extending from the fixation segment 44 and that the length of the fixation segment 44 may vary depending on the number and arrangement of fingers 42 therealong. Fingers 42 disposed on opposite sides of the fixation segment 44, i.e. on opposite sides of the central longitudinal axis 48, can be longitudinally non-aligned or offset such that the face is non-symmetrical as is the case for face 40 and fingers 42, or may be aligned with one another so that the face is symmetrical, depending on the arrangement of the heat-generating electrical components. The fingers 42 can be equally or uniformly spaced along the fixation segment 44 or may be non-equally or non-uniformly spaced along the fixation segment depending on the spacing for the heat-generating electrical components. The fingers 42 can have various geometric surface configurations including triangular and rectangular configurations. The length of the fingers from their bases to their tips may be varied for different locations and arrangements of heat-generating electrical components, and the fingers 42 may be of the same length or of different lengths depending on the locations of the bodies 14.

The spacer member 32 further comprises a protrusion 56 extending from each finger 42 to terminate at a contacting end. The protrusions 56 are all disposed along a first side 58 of face 40 and extend perpendicularly from the fingers 42 such that the protrusions 56 are perpendicular to plane P of fixation segment 44 when the face 40 is in the undeflected configuration. However, the protrusions 56 can extend from the fingers 42 at various angles and may be non-perpendicular to plane P in the undeflected configuration for the face 40. The protrusions 56 are located on the fingers 42 at, adjacent or close to the tips 54, respectively, to facilitate deflection of the fingers. The protrusions 56 may have various cross-sectional configurations which may be uniform or non-uniform along the length of the protrusions from face 40 to the contacting ends. The protrusions 56 are each depicted as being narrow or elongate with a base joined to the corresponding finger 42 and with a rounded contacting end. The bases of the protrusions 56 may be larger in cross-sectional size than the contacting ends for increased strength, and the protrusions may have a generally conical configuration. When the spring spacer assembly 30 is assembled to the printed circuit board 12 and heat sink 24 as explained in greater detail below, the fingers 42 are disposed over the bodies 14, respectively, in alignment therewith, and each protrusion 56 is aligned with a corresponding body 14. In particular, it is preferable that each protrusion 56 be located so as to be in alignment with the corresponding body 14 at or as close as possible to the axial center of the bodies. In the case of heat-generating electrical components 10, the protrusions 56 are each aligned with a main body section 20 when the spring spacer assembly 30 is assembled to the printed circuit board 12 and heat sink 24. As explained further below, the length of the protrusions 56 is selected so that, as a result of the spring spacer assembly 30 being assembled to the printed circuit board 12 and heat sink 24, the contacting ends contact the heat-generating electrical components 10 such that the fingers 42 are deflected from the plane P of fixation segment 44 as shown in FIG. 6.

The spacer member 32 further includes a plurality of spacers 46 along fixation segment 44 and extending from the first side 58 of face 40. The spacer member 32 has three spacers 46, and each spacer extends from the fixation segment 44 perpendicular to plane P of the fixation segment to terminate at an end surface 60. A lumen extends entirely through each spacer 46 coaxial and continuous with a corresponding channel through the fixation segment 44. Each lumen and its corresponding channel together define a continuous passage 62 extending entirely through the spacer member 32 and having a central longitudinal axis perpendicular to plane P of fixation segment 44. Each passage 62 has an entry opening along a second side 64 of face 40, opposite the first side 58, for insertion of a fixation element 38 and has an exit opening along end surface 60 through which the fixation element may protrude into the heat sink 24 as explained further below. The passages 62 are circular in cross-section with a uniform or constant diameter from the entry openings to the exit openings. Various uniform and non-uniform external cross-sectional configurations are possible for the spacers 46. In the illustrated embodiment, the spacers 46 each have a relatively larger external diameter cylindrical portion extending from the fixation segment 44 to a relatively smaller external diameter cylindrical portion that extends from the larger external diameter cylindrical portion to the end surface 60, the larger external diameter cylindrical portion being joined to the smaller external diameter cylindrical portion at a shoulder 66. As shown by FIG. 5, the end surfaces are disposed in a common plane P' parallel to plane P of fixation segment 44 for abutting the heat sink 24 and/or thermal interface 26 as described below in greater detail. The spacers 46 are located along the fixation segment 44 to be disposed, respectively, at each end 50 and in the gap between the first groups and the second groups of fingers 42.

When the fixation segment 44 is fixed or held in place by the fixation member 36 and fixation elements 38 as explained further below, the fingers 42 may be deflected, displaced or moved relative to the fixation segment 44 from the undeflected configuration to obtain the deflected configuration when an external deflection force F is applied against the contacting end of each protrusion 56 as depicted in FIGS. 5 and 6, it being noted that FIG. 5 shows a deflection force F applied to only one protrusion while FIG. 6 shows the heat-generating electrical components providing a deflection force for each protrusion. The deflection forces F, which may be applied normal to the fingers 42, causes the fingers to pivot or rotate about the fixation segment 44 so as to be deflected, moved or displaced from plane P. In the undeflected configuration, the fingers are in an initial position relative to the fixation element 44 and, in the case of face 40, the initial position for the fingers is co-planar with the fixation segment. In the deflected configuration, the fingers 42 are moved from the initial position in the direction of the deflection force vector shown by the arrow F in FIG. 5, and this direction is away from the thermal transfer surface of the heat sink as shown in FIG. 6. After deflection, the fingers 42 will have moved from the initial position to a deflected position relative to fixation segment 44.

It is preferred that face 40 of spacer member 32 be resilient or flexible to be disposed in a relaxed or non-stressed state in the undeflected configuration when no external force is applied thereto, to allow the fingers 42 to resiliently flex or deflect from plane P in response to the external deflection force being applied thereto to obtain a non-relaxed or stressed state in the deflected configuration, and to enable the face to be restored essentially to its undeflected configuration upon removal of the deflection force. Where face 40 of spacer member 32 is resilient or flexible, the spacer member 32 has spring properties due to its resilience. Accordingly, each deflected finger 42 exerts a reactive spring force in opposition to the deflection force F applied thereto as the fingers are biased to return to the undeflected configuration co-planar with fixation segment 44 and are therefore biased toward their initial position relative to the fixation segment. The spacer member 32 is preferably fabricated integrally, unitarily or monolithically as a single piece or part from a resilient or flexible material. Plastic materials are preferred for the spacer member since they may be economically molded into the desired configuration. Also, a plastic spacer member will not conduct electricity by virtue of the protrusions 56 being in contact with the bodies 14. A preferred plastic material for the spacer member is PBT D202G15 NA plastic material of Shinkong Synthetic Fibers Corporation. The spacers 46 and protrusions 56 are essentially rigid by virtue of their configurations, dimensions and/or structural arrangements, even though the spacer member may be made in its entirety of resilient or flexible material.

During assembly of the spring spacer assembly 30 to printed circuit board 12 and heat sink 24, deflection forces are applied against the contacting ends of the protrusions 56 by the bodies 14 of the heat-generating electrical components to cause deflection of fingers 42 in order to urge the thermal transfer surfaces of the bodies into thermal contact with the thermal transfer surface of the heat sink via a spring force applied by the fingers 42 and/or the spring 34 as shown by FIG. 6 and as described further below. The length of the protrusions 56 may be selected to ensure a predetermined amount of deflection for fingers 42 in accordance with the thickness of the bodies 14. Where the contacting ends of protrusions 56 are disposed between planes P and P' in the undeflected configuration, the length of protrusions 56 is selected so that the perpendicular distance from plane P' to the contacting ends in the undeflected configuration is less than the thickness of portions of bodies 14 contacted by the contacting ends and interposed between the contacting ends and thermal transfer surface of the heat sink. Where fingers 42 are co-planar with plane P in the undeflected configuration, the length of protrusions 56 will be greater than the distance between planes P and P' minus the thickness of the portions of bodies 14. It should be appreciated, however, that the protrusions 56 can be shorter than, the same length as, or longer than the spacers 46 and that the contacting ends of the protrusions can be disposed on either side of plane P' in the undeflected configuration, as shown by dotted lines in FIG. 5, so long as the protrusions 56 are of sufficient length for the contacting ends to contact the portions of bodies 14 between the printed circuit board 12 and the thermal transfer surface of heat sink 24 so as to cause a desired amount of deflection of fingers 42 when the end surfaces of spacers 46 are in abutment with the heat sink 24 and/or thermal interface 26. The spacer member 32 can be designed to provide a predetermined amount of deflection corresponding to a desired spring force for the spacer member 32 and/or the spring 34, and the spring force may be varied by varying the predetermined amount of deflection.

The spring 34 comprises a plate or face that is flat or planar in an undeformed condition shown in FIG. 3 and has an external surface configuration that matches the external surface configuration of face 40. The spring 34 is slightly smaller than face 40 so that, when the spring is placed upon the second side 64 of the face 40, the perimeter of the spring is disposed within the perimeter of the face. However, the spring 34 could be the same size as or larger than face 40 and can have any desired uniform or non-uniform thickness. Of course, it should be understood that various types of springs having various configurations may be used in the spring spacer assembly 30. The plate or face for spring 34 is configured as fingers 68 extending laterally outwardly from fixation segment 70 corresponding to the fingers 42 and fixation segment 44, respectively, of face 40. The spring 34 has holes 72 therethrough centered on a central longitudinal axis of fixation segment 70 for axial alignment with the passages 62, respectively, of spacer member 32 when the spring is secured by fixation member 36 and fixation elements 38 upon the second side 64 of face 40 as shown in FIG. 6 and as explained further below. The spring 34 is made of spring material so that the fingers 68 thereof are correspondingly deflected with the fingers 42 in response to the deflection forces to obtain a deformed condition for the spring depicted in FIG. 6. Accordingly, the undeformed condition for spring 34 corresponds to the undeflected configuration of face 40, and the deformed condition for the spring conforms to or follows the deflected configuration for face 40. It should be appreciated, however, that the undeformed condition can be different than the undeflected configuration and/or the deformed condition can be different than the deflected configuration so long as the spring is deflected by the fingers 42 to cause the application of a spring force against the fingers 42 in opposition to the deflection forces.

The fingers 68 of spring 34 in its deformed condition exert their own reactive spring forces in opposition to the deflection forces as the fingers 68 are biased to return to their undeformed condition co-planar with fixation segment 70. The deformed spring 34 thereby biases the deflected fingers 42 toward their initial position. Together, the reactive spring force of the spacer member 32 and the reactive spring force of the spring 34 provide a resultant reactive force for each protrusion 56 of sufficient strength or magnitude to urge the thermal transfer surfaces 18 of heat-generating electrical components 10 into thermal contact with the thermal transfer surface of heat sink 24 as explained further below. A preferred material for spring 34 is metal due to the ability of metal materials to supply the spring force needed to obtain sufficiently strong resultant reactive forces at protrusions 56. A metal spring 34 may be electrically insulated from the heat-generating electrical components 10 other electrical components on the printed circuit board and/or from the printed circuit board itself by forming the spacer member 32 of non-electrically conductive material such as plastic.

Where the reactive spring forces of fingers 42 are by themselves sufficiently strong to urge the thermal transfer surfaces 18 into contact with the thermal transfer surface of heat sink 24 with sufficient force, a separate spring 34 is not necessary and the entire resultant reactive forces may be supplied by the spacer member 32. However, materials capable of providing sufficiently strong reactive spring forces are generally very costly to fabricate in the configuration of the spacer member 32. In addition, it may be undesirable to have the spacer member 32 made of electrically conductive material in direct contact with the heat-generating electrical components via protrusions 56. Accordingly, it will generally be preferred to fabricate the spacer member 32 of less costly materials such as plastic which are non-electrically conductive and to utilize the separate spring 34 to obtain the necessary spring force. The spring 34 could also be made of plastic, and the spring spacer 31 and fixation member 36 may both be made of plastic. It should be appreciated that the spring spacer 31 may comprise only the spacer member 32 or may comprise the spacer member 32 and the spring 34. Where the spring spacer 31 comprises only the spacer member 32, the spacer member will function as a spring. It should be further understood that various springs can be formed integrally, unitarily with or internally within the spacer member 32. Where the separate spring 34 is provided, the entire resultant reactive forces may be supplied by the spring. In the latter case, it is not necessary for the spacer member 32 to provide any specific degree of spring force so long as the fingers 42 are deflectible, since the fingers of the spring will be deflected by the heat-generating electrical components. The spring 34 can be designed in many various ways and may comprise one spring or a plurality of individual springs for applying reactive spring forces against fingers 42.

The fixation member 36 comprises an elongate beam or bar for being disposed over the aligned fixation segments 44 and 70 when the spring 34 is disposed upon the second side 64 of face 40 with fixation segment 70 sandwiched between the fixation member 36 and fixation segment 44. The fixation member 36 has holes 74 therethrough for axial alignment with holes 72 of spring 34 and passages 62 of spacer member 32. The fixation member 36 may have a width the same size as the width of fixation segment 70 which, in the illustrated embodiment, is slightly smaller than the width of fixation segment 44. The fixation member 36 has a length of sufficient size so that holes 74 at the ends of the fixation member are aligned with the aligned holes 72 and passages 62 at the ends of the spacer member 32 and spring 34, respectively. The fixation member 36 is depicted with a square cross-sectional configuration that is uniform or constant along the length of the fixation member; however, other uniform and non-uniform cross-sectional configurations are possible as are various dimensions and sizes. One preferred material for the fixation member is aluminum, although various other materials may be used. It should be appreciated that the fixation member can be formed integrally, unitarily or monolithically with the spring 34 as a single component, thereby reducing the number of parts required. Where a separate spring 34 is not provided, the fixation member may be formed integrally, unitarily or monolithically with the spacer member 32 as a single component to enable the use of fewer parts. For example, the fixation segment 44 and/or the fixation segment 70 could be rigidified or thickened to serve as the fixation member.

The fixation elements 38 comprise threaded fasteners, such as screws, each insertable through an aligned arrangement of a hole 74, a hole 72 and a passage 62. The fixation elements 38 are of sufficient length such that ends of the fixation elements protrude from the exit openings of the passages 62 for threaded engagement in corresponding holes of heat sink 24 as described further below. The fixation elements 38 may comprise various types of fasteners including rivets and pins. The fixation elements 38 can extend through the spring spacer at various locations other than the spacers. Fixation elements or means external to the spring spacer could also be used to secure the spring spacer to the heat sink.

The heat sink 24 comprises a heat absorbing body of thermally conductive material and may have various configurations presenting one or more surfaces 76 against which the thermal transfer surfaces 18 of heat-generating electrical components 10 are urged or forced by the spring spacer assembly 30. Heat sink 24 has a surface 76 formed by a plateau disposed on a planar floor 78 of the heat sink. Surface 76 is planar but may have microscopic irregularities. The heat sink 24 includes a pair of planar side walls 80 perpendicularly joined to opposite sides of floor 78 in a generally H-shaped configuration. Portions of side walls 80 extend from floor 78 in the same direction as the plateau and terminate at or near inwardly extending flanges, respectively. Portions of side walls 80 extend from floor 78 in a direction opposite the plateau, and a series of fins 82 may be arranged between these side wall portions. The fins 82 run parallel to one another and have spaces therebetween to enhance dissipation of absorbed heat from the heat sink 24. Threaded holes 84, only one of which is visible in FIG. 6, are formed in the plateau along surface 76 for receiving the ends of fixation elements 38 in order to assemble the spring spacer assembly 30 to the heat sink 24 with the printed circuit board 12 disposed between the heat sink and the face 40 of spacer member 32. The heat sink can be of various configurations and sizes in accordance with the associated products. The heat sink 24 is typically a solid body made of metal, and conventional heat sinks can be used in the present invention as modified to include holes 84 at the proper locations along surface 76.

The surface 76 may comprise the thermal transfer surface of the heat sink 24. However, typically the thermal interface 26 will be disposed on the surface 76 to electrically insulate the heal sink from the heat-generating electrical components 10 and will comprise the thermal transfer surface of the heat sink. The thermal interface 26 comprises a pad or layer of material that is electrically insulative or non-conductive while being thermally conductive. The thermal interface 26 may be of uniform thickness and of sufficient surface area to cover all or portions of the surface 76 against which the thermal transfer surfaces 18 are urged or forced. The thermal interface 26 may have an adhesive backing or surface 86 for attachment of the thermal interface to the surface 76. The thermal interface 26 may be compressible. The thermal interface 26 is depicted as one continuous thermal pad having apertures 88 therein for alignment with the holes 84 in heat sink 24, respectively. The thermal interface 26 may comprise a sheet of silicon rubber, such as the SP-610-2IL silicon rubber sheets of Six Phase Co. Ltd. Various conventional thermal interfaces modified to include apertures 88 at the appropriate locations may be used with the present invention.

Where the thermal interface 26 is disposed on the surface 76, the thermal transfer surfaces 18 of heat-generating electrical components 10 will be urged into contact with the thermal interface, and heat from the heat-generating electrical components will be conducted to the heat sink 24 via the thermal interface. As used herein, the "thermal transfer surface" of the heat sink is intended to encompass a surface of the heat sink itself not having a thermal interface disposed thereon and/or a thermal interface carried by a surface of the heat sink. Apertures 88 are large enough in size to permit the ends of fixation elements 38 to pass therethrough for threaded engagement in holes 84 of heat sink 24. The apertures 88 may also be large enough in size to permit the spacers 46 to pass therethrough for abutment of end surfaces 60 with the surface 76 of the heat sink 24. Alternatively, the apertures 88 may be smaller than the external cross-sectional size of spacers 46 so that the end surfaces 60 abut the thermal interface 26 when the ends of fixation elements 38 are threadedly engaged in holes 84.

The printed circuit board 12 may be any type of printed circuit board or substrate mounting the heat-generating electrical components at predetermined locations and may also mount various types of electrical components or other components as well as comprising one or more electrical circuits. Holes 90 corresponding to spacers 46, respectively, are formed through the printed circuit board 12 in the space between the first and second rows of heat-generating electrical components 10 at locations corresponding to the locations for spacers 46. The holes 90 are of a size to allow the relatively smaller external diameter cylindrical portions of spacers 46 to pass therethrough while preventing passage therethrough of the shoulders 66. Apertures 92 for receiving protrusions 56 respectively therethrough are formed through the printed circuit board 12 at locations aligned with the main body sections 20 of heat-generating electrical components 10 as best seen with reference to FIGS. 2 and 6. The appropriate locations for holes 90 and apertures 92 are predetermined from the locations of spacers 46 and protrusions 56 such that preparation of the printed circuit board to receive the spring spacer assembly is greatly simplified. Various standard printed circuit boards modified to include holes 90 and apertures 92 may be used with the present invention.

As shown in FIGS. 3 and 6, the spring spacer assembly 30 is assembled to the printed circuit board 12 and the heat sink 24 with the printed circuit board disposed over the thermal transfer surface of the heat sink, such that the heat-generating electrical components 10 are disposed between the printed circuit board and the thermal transfer surface of the heat sink with the thermal transfer surfaces 18 facing the thermal transfer surface of the heat sink. The spacers 46 of the spacer member 32 are inserted in the corresponding holes 90 in printed circuit board 12 while simultaneously the protrusions 56 are inserted in the corresponding apertures 92 in the printed circuit board 12. The spring 34 is disposed over the second side 64 of face 40, such that the face 40 is interposed between the spring 34 and the printed circuit board 12. The fingers 68 of the spring 34 are in contact with the corresponding fingers 42 of the spacer member 32, and the holes 72 in the spring are aligned with the entry openings of the corresponding passages 62. The fixation member 36 is positioned over the fixation segment 70 of the spring 34, such that the spring is disposed between the fixation member and the second side 64 of face 40. The holes 74 in the fixation member 36 are aligned with the corresponding holes 72 of the spring 34 in alignment with the passages 62, respectively.

The ends of fixation elements 38 are inserted through the aligned holes 74, holes 72 and passages 62. Ends of the fixation elements 38 will protrude from the exit openings of the passages 62, and the protruding ends are inserted through the corresponding apertures 88 of thermal interface 26 into the corresponding threaded holes 84 of heat sink 24. The fixation elements 38 are turned or rotated for advancement into the threaded holes 84 to establish a threaded engagement therewith. The fixation elements 38 are tightened until the end surfaces 60 of the spacers 46 bear against the thermal transfer surface of heat sink 24, i.e. thermal interface 26 and/or surface 76, in a fully assembled condition for the spring spacer assembly. When fully assembled, the printed circuit board 12, heat sink 24 and spring spacer assembly 30 form a thermally protected electrical component system as depicted in FIG. 6. In FIG. 6, the spacers 46 are shown passing through the apertures 88 in the thermal interface 26 so that the end surfaces 60 bear against the surface 76 of the heat sink.

As the fixation elements 38 are tightened, the spring spacer 31 is moved toward the heat sink 24, and the shoulders 66 engage the printed circuit board 12. The shoulders 66 in engagement with the printed circuit board 12 causes the printed circuit board to be moved toward the heat sink 24 as the spring spacer 31 is moved theretoward. The contacting ends of protrusions 56 contact and are forced against portions of the bodies 14 of the heat-generating electrical components 10, respectively. In particular, the contacting ends of the protrusions 56 contact and are forced against the main body sections 20 at or close to the axial centers of the bodies 14. As shown in FIG. 6, the contacting end of each protrusion 56 contacts the corresponding main body section 20 adjacent, near or close to the side of the main body section from which the flange section 22 extends. The contacting ends contact the surfaces of bodies 14 opposite the thermal transfer surfaces 18.

When the thermal transfer surfaces 18 are in contact with the thermal transfer surface of the heat sink, further advancement of the spring spacer causes the main body sections 20 to exert deflection forces against the protrusions 56, causing the fingers 42 to deflect from the undeflected configuration to the deflected configuration. The fingers 68 of the spring 34 are correspondingly deflected with the fingers 42 for movement from the undeformed condition to the deformed condition. The fixation segments 44 and 70 remain in their original planar configurations and are held in place by the fixation member 36 and fixation elements 38, while the fingers 42 and 68 are deflected out of the planes of the fixation segments 44 and 70, respectively, in a direction away from the thermal transfer surface of the heat sink. The protrusions 56 move within the apertures 92 of the printed circuit board as the fingers 42 deflect. As a result of the fingers 42 and 68 being deflected, resultant reactive forces are applied against the main body sections 20 via the contacting ends of protrusions 56, respectively. The resultant reactive forces are applied to the main body sections 20 in the direction of the thermal transfer surface of heat sink 24, thereby forcing or urging the thermal transfer surfaces 18 of the heat-generating electrical components 10 into thermal contact with the thermal transfer surface of the heat sink.

The thermal transfer surfaces 18 are urged into contact with the thermal transfer surface of the heat sink 24 with sufficient force to maintain the entirety of each thermal transfer surface 18 in thermal contact with the thermal transfer surface of the heat sink. Since the resultant reactive forces are applied at, near or dose to the axial centers of the bodies 14, the applied forces are more uniform along the thermal transfer surfaces 18 and the bodies 14 do not tilt or otherwise move out of thermal contact with the thermal transfer surface of the heat sink. The spacers 46 maintain the fixation segment 44 the proper distance from the thermal transfer surface of the heat sink 24. The printed circuit board 12 is confined between the face 40 and the thermal transfer surface of the heat sink 24, with the shoulders 66 engaging the printed circuit board to prevent the printed circuit board from moving away from the heat sink. However, it is not necessary for the shoulders 66 to be disposed in engagement or abutment with the printed circuit board.

Figure 7:
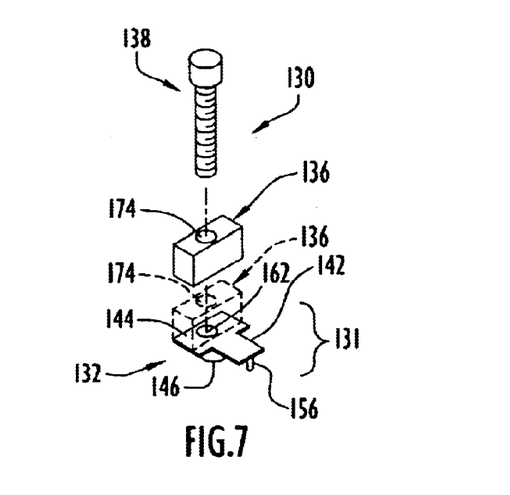
FIG. 7 is an exploded perspective view of an alternative spring spacer assembly according to the present invention.

FIG. 7 depicts an alternative spring spacer assembly 130 according to the present invention. Spring spacer assembly 130 is similar to spring spacer assembly 30 but is designed for maintaining a single heat-generating electrical component in thermal contact with a thermal transfer surface of a heat sink. The spring spacer assembly 130 includes spring spacer 131, fixation member 136 and fixation element 138. Spring spacer 131 comprises spacer member 132 without a separate spring. Spacer member 132 comprises a single finger 142 extending laterally from fixation segment 144. Finger 142 and fixation segment 144 are similar to the fingers 42 and fixation segment 44, except that finger 142 has a rectangular surface configuration and the entire resultant reactive force is provided by the finger 142. One spacer 146 extends from the fixation segment 144, and the protrusion 156 extends from the finger 142. Only one passage 162 is provided in the spacer member 132 for the single fixation element 138. The fixation member 136 is similar to the fixation member 36 but is of reduced length in accordance with the shorter length of fixation segment 144 and has only one hole 174 for fixation element 138. As described above, the fixation member 136 could be formed integrally, unitarily or monolithically with the fixation segment 144 as shown in dotted lines. Fixation element 138 is similar to fixation element 38. Assembly of the spring spacer assembly 130 to a printed circuit board and heat sink is similar to that described above. Only one threaded hole 84 is required in the heat sink to receive fixation element 138, only one hole 90 is required in the printed circuit board for spacer 146, and only one aperture 192 is required in the printed circuit board for protrusion 156.

The spring spacer assemblies of the present invention comprise a minimal number of simple parts which may be assembled without difficulty to a heat sink via a printed circuit board in spaced relation with the heat sink. The spring spacer assemblies do not comprise any components which penetrate or extend through the heat-generating electrical components. The spring spacer assemblies apply a spring force to the bodies of the heat-generating electrical components at optimal locations to ensure good thermal contact between the thermal transfer surfaces of the heat-generating electrical components and the thermal transfer surface of the heat sink. Good thermal contact between the thermal transfer surfaces of the heat-generating electrical components and the thermal transfer surface of the heat sink may be attained in spite of variations in the mounting locations for the heat-generating electrical components on the printed circuit board, since the protrusions can contact the bodies 14 at various locations and still achieve good thermal contact. Variations in thicknesses for the bodies 14 as well as assembly tolerances are thusly accounted for. Continuous thermal contact is maintained even where vibration, thermal expansion and/or thermal contraction occur. The spring spacer assemblies maintain the printed circuit board in properly spaced relation with the heat sink and limit movement of the printed circuit board away from the heat sink. The faces of the spring spacer assemblies are spaced from the second side of the printed circuit board and do not interfere with components or circuitry on the second side of the printed circuit board. Only a minimal amount of space on the printed circuit board is needed to accommodate the spacers and the protrusions, thereby maximizing the amount of remaining available space on the printed circuit board for other uses. The spring spacer assemblies do not add significantly to the height or depth of the assembled printed circuit board and heat sink and do not extend beyond the footprint of the printed circuit board.

The spring spacers may comprise a spacer member with or without a separate spring. Where a separate spring is provided, the spacer member may apply some or no spring force against the heat-generating electrical components. The face of the spacer member and/or the face of the spring may be planar or non-planar prior to being deflected by the heat-generating electrical components. The fingers of the spacer member and/or the fingers of the spring may be disposed at various angles to the planes of the corresponding fixation segments prior to deflection. The fingers do not have to be planar and may have various configurations and sizes. The fingers of the spacer member may be deflectable by virtue of their structural configuration and/or materials of construction. The fingers of the spring may be deformable by virtue of being formed of spring materials. The fixation segments do not have to be planar and may have various configurations and sizes. The length of the protrusions can be less than, the same as, or greater than the length of the spacers. The protrusions may extend from the fingers at various angles and may have various configurations. The spacers may have various configurations and sizes of uniform or non-uniform cross-section, and any suitable number of spacers may be provided in the spring spacer assemblies. The springs may each comprise a single spring member or a plurality of individual spring members. Separate fixation members are not required, and the fixation segments of the spacer members and/or the springs can be designed to serve as the fixation members. Various types of fixation elements arranged in various ways at various locations can be used in the spring spacer assemblies. Any suitable number of fixation elements can be used.

Inasmuch as the present invention is subject to many variations, modifications and changes in detail, it is intended that all subject matter discussed above or shown in the accompanying drawings be interpreted as illustrative only and not be taken in a limiting sense.

What is claimed is:

1. A spring spacer assembly for maintaining thermal contact between a thermal transfer surface of a heat sink and a heat-generating electrical component mounted on a printed circuit board between the printed circuit board and the thermal transfer surface, comprising a spring spacer including a face defining a fixation segment and a deflectible finger extending from said fixation segment, a spacer extending from said fixation segment on a first side of said face and a protrusion extending from said finger on said first side of said face, said face having an undefected configuration in which said finger is disposed in an initial position relative to said fixation segment, said spacer and said protrusion being insertable through the printed circuit board with said face in said undeflected configuration to place said spacer in abutment with the thermal transfer surface and to contact the heat-generating electrical component with said protrusion, said protrusion having a length to cause movement of said face from said undeflected configuration to a deflected configuration in which said finger is moved relative to said fixation segment from said initial position in a direction away from the thermal transfer surface when said spacer is placed in abutment with the thermal transfer surface and said protrusion contacts the heat-generating electrical component, said finger being biased toward said initial position to urge the heat-generating electrical component into thermal contact with the thermal transfer surface; and a fixation element for securing said spring spacer to the heat sink with said spacer in abutment with the thermal transfer surface.

2. The spring spacer assembly recited in claim 1 wherein said finger is spring biased toward said initial position.

3. The spring spacer assembly recited in claim 2 wherein said finger is resilient.

4. The spring spacer assembly recited in claim 2 and further comprising a spring for biasing said finger toward said initial position.

5. The spring spacer assembly recited in claim 4 wherein said finger is resilient.

6. The spring spacer assembly recited in claim 1 wherein said fixation segment is planar, said finger is planar and said finger is co-planar with said fixation segment in said undeflected configuration and extends at an angle to said fixation segment in said deflected configuration.

7. The spring spacer assembly recited in claim 6 wherein said spacer extends perpendicularly from said fixation segment.

8. The spring spacer assembly recited in claim 6 wherein said protrusion extends perpendicularly from said finger.

9. The spring spacer assembly recited in claim 6 wherein said spring spacer comprises a spacer member defining said face and further comprising a spring including a planar fixation segment for being disposed over said fixation segment of said spacer member along a second side of said face, opposite said first side, and a planar finger extending from said fixation segment of said spring for being disposed over said finger of said spacer member along said second side of said face, said spring being movable by said face from an undeformed condition corresponding to said undeflected configuration of said face to a deformed condition conforming to said deflected configuration of said face, said spring being biased toward said undeformed condition.

10. The spring spacer assembly recited in claim 6 wherein said finger extends laterally from said fixation segment and has a triangular surface configuration.

11. The spring spacer assembly recited in claim 6 wherein said finger extends laterally from said fixation segment and has a rectangular surface configuration.

12. The spring spacer assembly recited in claim 9 wherein said spacer member is made integrally, unitarily of plastic and said spring is made integrally, unitarily of metal.

13. The spring spacer assembly recited in claim 1 wherein said finger extends laterally from said fixation segment to terminate at a tip and said protrusion is disposed near said tip of said finger.

14. A spring spacer assembly for maintaining thermal contact between a thermal transfer surface of a heat sink and a heat-generating electrical component mounted on a printed circuit board between the printed circuit board and the thermal transfer surface, comprising
   a spring spacer including a face defining a fixation segment and a finger extending from and deflectible relative to said fixation segment, a protrusion extending from said finger on a first side of said face for insertion through a corresponding aperture in the printed circuit board, and a spacer extending from said fixation segment on said first side of said face and terminating at an end surface for insertion through a corresponding hole in the printed circuit board into abutment with the thermal transfer surface; and
   a fixation element for securing said end surface in abutment with the thermal transfer surface, said protrusion contacting and being deflected by the heat-generating electrical component to cause deflection of said finger in a direction away from the thermal transfer surface in response to said end surface being secured in abutment with the thermal transfer surface, said finger being adapted, when deflected, to apply a spring force against the heat-generating electrical component in the direction of the thermal transfer surface to urge the heat-generating electrical component into thermal contact with the thermal transfer surface.

15. The spring spacer assembly recited in claim 14 wherein said spring spacer comprises a spacer member defining said face and a spring for being disposed against said finger along a second side of said face, opposite said first side, for applying a spring force against said finger in the direction of the thermal transfer surface.

16. The spring spacer assembly recited in claim 15 wherein said spring comprises a face for being disposed over said second side of said face of said spacer member and defining a fixation segment for being disposed over said fixation segment of said spacer member and a deflectible finger for being disposed over said finger of said spacer member, said finger of said spring being deflected along with said finger of said spacer member in the direction away from the thermal transfer surface to apply a spring force against said finger of said spacer member.

17. The spring spacer assembly recited in claim 15 wherein said finger of said spacer member is resiliently deflected in the direction away from the thermal transfer surface to apply a spring force against the heat-generating electrical component in the direction of the thermal transfer surface.

18. The spring spacer assembly recited in claim 16 and further including a fixation member for being disposed over said fixation segment of said spring and said fixation element extends through said fixation segment of said spring, said fixation segment of said spacer member and said spacer into engagement with the heat sink.

19. The spring spacer assembly recited in claim 14 wherein said spacer comprises a shoulder for abutment with the printed circuit board when said end surface is secured in abutment with the thermal transfer surface, said shoulder limiting movement of the printed circuit board away from the heat sink.

20. The spring spacer assembly recited in claim 14 wherein said face defines a plurality of said fingers extending from said fixation segment corresponding to a plurality of the heat-generating electrical components, respectively, mounted on the printed circuit board between the printed circuit board and the thermal transfer surface, and said spring spacer comprises a plurality of said protrusions extending from said fingers, respectively, for insertion through a plurality of corresponding apertures in the printed circuit board, said plurality of said protrusions contacting and being deflected by the plurality of heat-generating electrical components, respectively, to cause deflection of said plurality of said fingers in the direction away from the thermal transfer surface in response to said end surface being secured in abutment with the thermal transfer surface, said plurality of said fingers being adapted, when deflected, to apply a spring force against the plurality of heat-generating electrical components, respectively, in the direction of the thermal transfer surface to urge the plurality of heat-generating electrical components into thermal contact with the thermal transfer surface.

21. The spring spacer assembly recited in claim 20 and further comprising a plurality of said spacers at spaced locations along said fixation segment and a plurality of said fixation elements extending through said spacers, respectively, into engagement with the heat sink.

22. The spring spacer assembly recited in claim 21 and further comprising a fixation member for being disposed over said fixation segment along a second side of said face, opposite said first side, and said plurality of said fixation elements extend through said fixation member.

23. The spring spacer assembly recited in claim 20 wherein said spring spacer comprises a spacer member defining said face and a spring for being disposed against said plurality of said fingers along a second side of said face, opposite said first side, for applying a spring force against said plurality of said fingers in the direction of the thermal transfer surface.

24. The spring spacer assembly recited in claim 23 wherein said spring comprises a face for being disposed over said second side of said face of said spacer member and defining a fixation segment for being disposed over said fixation segment of said spacer member and a plurality of resiliently deflectible fingers for being disposed over said plurality of said fingers of said spacer member, respectively, said plurality of said fingers of said spring being deflected along with said plurality of said fingers of said spacer member in the direction away from the thermal transfer surface to apply a spring force against said plurality of said fingers of said spacer member, respectively.

25. The spring spacer assembly recited in claim 14 wherein said fixation element comprises a screw.

26. A thermally protected electrical component system comprising
   a heat sink having a thermal transfer surface;
   a printed circuit board spaced from said thermal transfer surface and having a heat-generating electrical component mounted thereon between said thermal transfer surface and a first side of said printed circuit board, an aperture extending through said printed circuit board in alignment with the heat-generating electrical component, and a hole extending through said printed circuit board; and a spring spacer assembly comprising a face disposed over a second side of said printed circuit board, opposite said first side, and defining a fixation segment and a deflectible finger extending from said fixation segment, a spacer extending from said fixation segment through said hole and secured in abutment with said heat sink, and a protrusion extending from said finger through said aperture into contact with said heat-generating electrical component, said finger being spring biased toward said thermal transfer surface to urge said heat-generating electrical component into thermal contact with said thermal transfer surface.

27. The thermally protected electrical component system recited in claim 26 wherein said thermal transfer surface comprises a thermal interface disposed on a surface of said heat sink.

28. The thermally protected electrical component system recited in claim 26 wherein said heat-generating electrical component comprises a body, said aperture in said printed circuit board is at least substantially in alignment with an axial center of said body, said protrusion extends from said finger through said aperture to contact said body at least substantially at said axial center, and said finger urges said body into thermal contact with said thermal transfer surface.

29. The thermally protected electrical component system recited in claim 26 wherein said spring spacer assembly further comprises a fixation member disposed over said fixation segment with said fixation segment disposed between said fixation member and said face, a hole in said fixation member aligned with a passage through said fixation segment and spacer, a threaded hole in said heat sink aligned with said passage and a screw extending through said hole in said fixation member and said passage into threaded engagement with said threaded hole of said heat sink.

30. The thermally protected electrical component system recited in claim 29 and further comprising a spring disposed over said face between said fixation member and said face, said spring having a surface configuration corresponding to a surface configuration of said face.

31. The thermally protected electrical component system recited in claim 30 wherein said face and said spring are deflected by the heat-generating electrical component when said spacer is secured in abutment with said heat sink.

* * * * *